(12) United States Patent
Ki et al.

(10) Patent No.: US 12,421,425 B2
(45) Date of Patent: Sep. 23, 2025

(54) RESIN COMPOSITION AND DISPLAY APPARATUS INCLUDING THE SAME

(71) Applicant: Samsung Display Co., Ltd., Yongin-si (KR)

(72) Inventors: Bookan Ki, Yongin-si (KR); Hoyun Byun, Yongin-si (KR); Donghyeon Lee, Yongin-si (KR); Sebeen Lee, Yongin-si (KR); Jeongin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 462 days.

(21) Appl. No.: 18/069,563

(22) Filed: Dec. 21, 2022

(65) Prior Publication Data
US 2023/0265314 A1 Aug. 24, 2023

(30) Foreign Application Priority Data
Feb. 22, 2022 (KR) .......................... 10-2022-0023132

(51) Int. Cl.
*C09J 4/06* (2006.01)
*C09J 11/06* (2006.01)
(Continued)

(52) U.S. Cl.
CPC ................. *C09J 4/06* (2013.01); *C09J 11/06* (2013.01); *C09J 133/14* (2013.01); *G02B 1/04* (2013.01);
(Continued)

(58) Field of Classification Search
CPC ... C09J 4/06; C09J 11/06; C09J 133/14; C09J 2433/00; C09J 2475/00; C09J 7/38;
(Continued)

(56) References Cited

U.S. PATENT DOCUMENTS 5,578,693 A * 11/1996 Hagstrom .............. C08G 18/10
528/65
7,109,252 B2 * 9/2006 Leon .................. C08G 18/4845
528/65

(Continued)

FOREIGN PATENT DOCUMENTS

CN 111440585 A 7/2020
JP 20140181330 A 9/2014

(Continued)

OTHER PUBLICATIONS

Abdel-Wakil, Walid S., et al. "Assessment of vinyl acetate polyurethane-based graft terpolymers for emulsion coatings: Synthesis and characterization." Journal of Macromolecular Science, Part A, vol. 57, No. 4, Nov. 18, 2019, pp. 229-243, https://doi.org/10.1080/10601325.2019.1691448. (Year: 2019).*

(Continued)

*Primary Examiner* — J. E. Schoenholtz
(74) *Attorney, Agent, or Firm* — CANTOR COLBURN LLP

(57) ABSTRACT

A resin composition and a display apparatus including the resin composition, wherein the resin composition includes: a modified (meth)acrylic-urethane oligomer having a weight average molecular weight (Mw) of greater than or equal to 25,000 g/mol and a glass transition temperature (Tg) of less than or equal to −30° C.; a photopolymerizable monomer; and a photoinitiator.

20 Claims, 7 Drawing Sheets

(51) Int. Cl.
*C09J 133/14* (2006.01)
*G02B 1/04* (2006.01)
*H10K 59/80* (2023.01)
*H10K 77/10* (2023.01)
*H10K 102/00* (2023.01)

(52) U.S. Cl.
CPC ....... *H10K 59/8722* (2023.02); *H10K 77/111* (2023.02); *C09J 2433/00* (2013.01); *C09J 2475/00* (2013.01); *H10K 2102/311* (2023.02)

(58) Field of Classification Search
CPC .... G02B 1/04; H10K 59/8722; H10K 77/111; H10K 2102/311; H10K 59/87; C08F 283/006; C08F 290/067; C08F 2/50; C08F 220/18; C08G 18/75; G09F 9/301
See application file for complete search history.

(56) References Cited

U.S. PATENT DOCUMENTS

| | | | |
|---|---|---|---|
| 9,346,986 | B2 | 5/2016 | Kim et al. |
| 2015/0232707 | A1 | 8/2015 | Yoon et al. |
| 2019/0345340 | A1* | 11/2019 | Kovalev ............ C08G 18/4825 |
| 2022/0017674 | A1* | 1/2022 | Bailey ................ C08G 18/672 |
| 2023/0015729 | A1* | 1/2023 | Shin ........................ C09J 11/06 |

FOREIGN PATENT DOCUMENTS

| | | | |
|---|---|---|---|
| JP | 2017165807 | A | 9/2017 |
| KR | 20130063939 | A | 6/2013 |
| KR | 20140023624 | A | 2/2014 |
| KR | 10-20140085256 | A | 7/2014 |
| KR | 10-20150007696 | A | 1/2015 |
| KR | 10-20150078040 | A | 7/2015 |
| KR | 10-1820087 | B1 | 1/2018 |
| KR | 10-2117068 | B1 | 5/2020 |
| KR | 10-2229884 | B1 | 3/2021 |
| KR | 1020210130614 | A | 11/2021 |

OTHER PUBLICATIONS

English Abstract of KR 1020130010583 (English Absract for KR 10-1820087).
B.K. Kim, et al., Preparation and Properties of UV-Curable Polyurethane Acrylates, J. Appl. Polym. Sci., vol. 60, 1996, 799-805.
English Absract of KR 1020190092163 (Used as English Abstract for KR 10-2117068).
English Abstract of JP 2017-165807.
English Abstract of KR 10-2015-0007696.
English Abstract of KR 10-2015-0078040.
English Abstract of KR 10-2229884.
S. Piril Ertema, et al., Effect of soft segment molecular weight on tensile properties of poly(propyleneoxide) based polyurethaneureas, Polymer 53 (2012) 4614-4622, 9 pp.
English Abstract of CN 111440585.
English Abstract of JP 2014-181330.
English Abstract of KR 10-2013-0063939.
English Abstract of KR 10-2021-0130614.
International Search Report dated May 15, 2023, issued in PCT Patent Application No. PCT/KR2023/002355, 3 pp.

* cited by examiner

DEFECTIVE

GOOD

RESIN COMPOSITION AND DISPLAY APPARATUS INCLUDING THE SAME

CROSS-REFERENCE TO RELATED APPLICATION

This application claims priority to Korean Patent Application No. 10-2022-0023132, filed on Feb. 22, 2022, in the Korean Intellectual Property Office, and all the benefits accruing therefrom under 35 U.S.C. § 119, the disclosure of which in its entirety is incorporated by reference herein.

BACKGROUND

1. Field

One or more embodiments relate to a resin composition and a display apparatus including the resin composition, and more particularly, to a resin composition having reduced creep recovery and a display device including the resin composition having reduced creep recovery.

2. Description of the Related Art

In recent years, display apparatuses have become thinner and lighter, and thus, their range of applications is continuing to expand. As display apparatuses become more adopted and diversified, various methods of designing the shapes and mechanical functions of display apparatuses are of interest and being studied.

In a display apparatus in the art, a cover window for protecting substructures is positioned on a display panel, and an optically clear adhesive (OCA) is used for bonding the cover window to the display panel. However, in the production process the use of an OCA in the process can be cumbersome as a defoaming process is often required due to the inflow of air bubbles in the bonding process, and this can present a limit to the manufacturing of a relatively large display apparatus.

To address such technical limitations of the OCA, research on a photocurable resin composition that can form a strong and long lasting attachment between a display panel and a cover window has been conducted.

However, in the case of foldable display panels there remains a problem associated with cracks in, or detachment of, the cover window with photocurable resin compositions in the art during the testing of repeated folding experiments, and thus there is a limit to commercialization of such displays. There is currently a demand for a photocurable resin composition having sufficient long-term flexibility or stability and favorable processability during manufacture.

SUMMARY

One or more embodiments include a resin composition and a display apparatus including the resin composition, wherein the resin composition is mechanically stable after repeated folding and unfolding and exhibits a decrease in repeated creep recovery.

Additional aspects will be set forth in part in the description which follows and, in part, will be apparent from the description, or may be learned by practice of the presented embodiments of the disclosure.

According to one or more embodiments, a resin composition includes a modified (meth)acrylic-urethane oligomer having a weight average molecular weight (Mw) of greater than or equal to 25,000 grams per mole (g/mol) and a glass transition temperature (Tg) of less than or equal to $-30°$ C., a photopolymerizable monomer, and a photoinitiator.

According to one or more embodiments, a display apparatus includes a display panel, a cover window arranged on the display panel, and a photocurable adhesive layer arranged between the display panel and the cover window, wherein the photocurable adhesive layer includes a modified (meth)acrylic-urethane oligomer having a weight average molecular weight (Mw) of greater than or equal to 25,000 g/mol and a glass transition temperature (Tg) of less than or equal to $-30°$ C., a photopolymerizable monomer, and a photoinitiator.

According to one or more embodiments, a photocurable adhesive including the resin composition.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
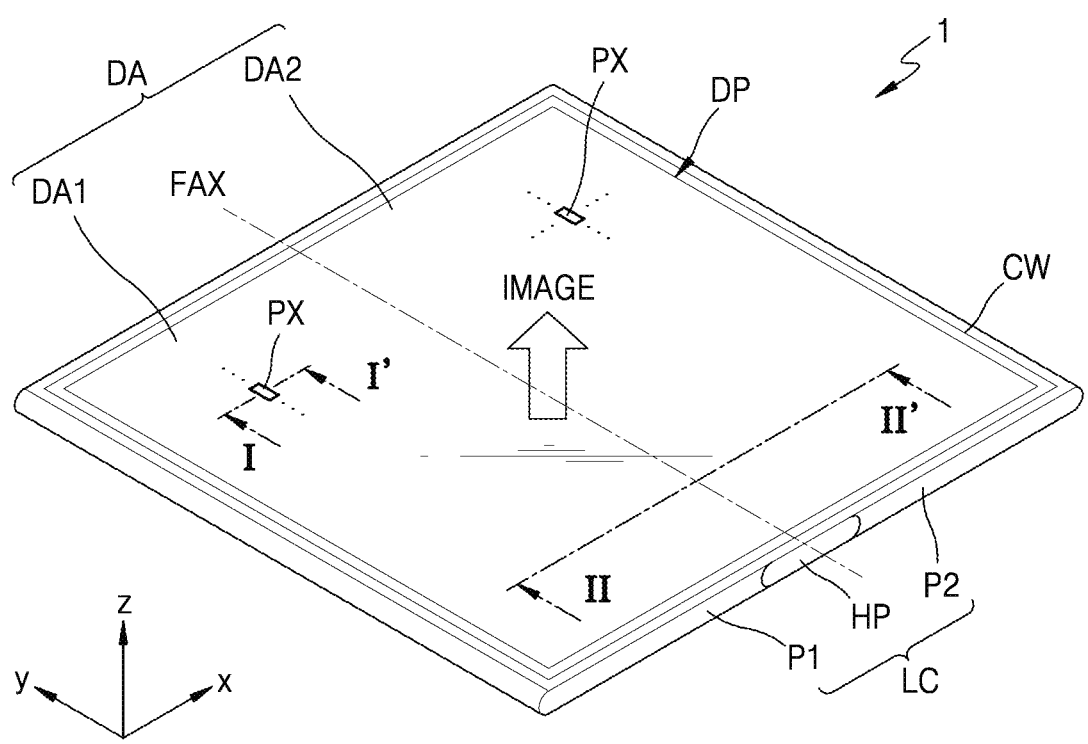
FIGS. 1 and 2 are perspective views each schematically illustrating a portion of a display apparatus according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Throughout the disclosure, the expression "at least one of a, b, or c" indicates only a, only b, only c, both a and b, both a and c, both b and c, all of a, b, and c, or variations thereof.

It will be understood that, although the terms first, second, etc. may be used herein to describe various elements, components, regions, layers and/or sections, and these elements, components, regions, layers, and/or sections should not be limited by these terms. These terms are only used to distinguish one element component, region, layer, or section from another element, component, region, layer, or section. Thus, "a first element," "component," "region," "layer," or "section" discussed below could be termed a second element, component, region, layer, or section without departing from the teachings herein.

In the embodiments described in the present specification, an expression used in the singular encompasses the expression of the plural, unless it has a clearly different meaning in the context.

It will be understood that when a layer, region, or component is referred to as being "on" or "onto" another layer, region, or component in the present specification, it may be directly or indirectly formed on the other layer, region, or component. That is, for example, intervening layers, regions, or components may be present.

It will be understood that when a layer, region, or component is referred to as being "connected to" another layer, region, or component, the layer, region, or component may be directly connected to another layer, region, or component, and/or indirectly connected to another layer, region, or component as intervening layer, region, or component is present. For example, it will be understood that when a layer, region, or component is referred to as being "electrically connected to" another layer, region, or component, the layer, region, or component may be directly electrically connected to another layer, region, and/or component, or indirectly electrically connected to another layer, region, or component as intervening layer, region, or component is present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "-based" as used herein means that the compound, monomer, oligomer, or polymer includes or contains the named moiety or a derivative thereof. For example, an "alicyclic group-containing diisocyanate-based" monomer includes an alicyclic moiety and a diisocyanate moiety. Similarly, a "benzoin-based compound" includes (contains) a benzoin compound or benzoin moiety.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the present specification, the x-axis, y-axis, and z-axis are not limited to three axes in an orthogonal coordinate system and may be interpreted in a broad sense including these axes. For example, the x-axis, y-axis, and z-axis may refer to those orthogonal to each other, or may refer to those in different directions that are not orthogonal to each other.

The terms "oligomer" or "polymer" are at times used interchangeably and refers to a reaction product derived from a reaction mixture of monomer or two or more different monomers, and having at least one of repeating unit.

The term "$C_1$-$C_{20}$ alkyl group" as used herein refers to a linear or branched aliphatic hydrocarbon monovalent group that has 1 to 20 carbon atoms, and specific examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{20}$ alkylene group" as used herein refers to a divalent group having the same structure as the $C_1$-$C_{20}$ alkyl group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and the like. The term "$C_3$-$C_{10}$ cycloalkylene group" as used herein refers to a divalent group having the same structure as the $C_3$-$C_{10}$ cycloalkyl group.

When a specific example may be implemented differently, a specific process order may be performed differently from the described order. For example, two processes described in succession may be performed substantially simultaneously or may be performed in an order opposite to the described order.

In the present specification, an organic light-emitting display apparatus is provided as an example of a display apparatus according to an embodiment, but embodiments of the present disclosure are not limited thereto. In one or more embodiments, a display apparatus of the present disclosure may be an inorganic light-emitting display apparatus, an inorganic electroluminescent display apparatus, or a quantum dot light-emitting display apparatus. For example, an emission layer of display elements included in a display apparatus may include an organic material, an inorganic material, a quantum dot, both an organic material and a quantum dot, or both an inorganic material and a quantum dot.

An aspect of the present disclosure provides a resin composition including a modified (meth)acrylic-urethane oligomer having a weight average molecular weight (Mw) of greater than or equal to 25,000 g/mol and a glass transition temperature (Tg) of less than or equal to −30° C., a photopolymerizable monomer, and a photoinitiator.

The alicyclic-group of the alicyclic group-containing diisocyanate-based monomer may include a $C_3$-$C_{10}$ cycloalkyl group-containing diisocyanate-based monomer whereby upon forming the resin upon curing the $C_3$-$C_{10}$ cycloalkyl group is incorporated into the backbone of the oligomer (polymer).

In an embodiment, the modified (meth)acrylic-urethane oligomer may have an isocyanate group at the terminal ends.

In an embodiment, the modified (meth)acrylic-urethane oligomer may be represented by Formula 1:

Formula 1

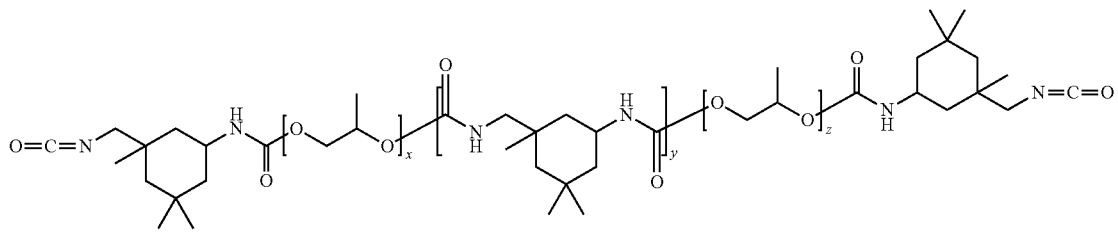

wherein, in Formula 1, x, y, and z may each independently be an integer from 1 to 350, and x, y, and z may each independently be selected such that the oligomer represented by Formula 1 may have a molecular weight of greater than or equal to 25,000 grams per mole (g/mol).

Here, the term "weight average molecular weight" as used herein refers to an average molecular weight obtained by averaging molecular weights of component molecular species of an oligomer by weight fraction and may be measured by light scattering method or the like. The glass transition temperature indicates the temperature at which a polymer material starts to soften, e.g., transition to a state of lower viscosity, with a change in temperature. For example, the glass transition temperature may refer to the temperature at which an oligomer (polymer) in a solid state begins to transition to a soft state, e.g., a rubber.

The resin composition may increase fluidity by including a modified (meth)acrylic-urethane oligomer that satisfies a specific weight average molecular weight and a specific glass transition temperature. As a result, the hysteresis of an adhesive layer that is formed by photocuring may decrease, thereby reducing a creep recovery strain rate after repeated folding/unfolding of the resin composition. Due to a reduced creep recovery strain rate, improved adhesion by the adhesive layer may be provided between a display panel and a cover window in a display apparatus to be described below.

Here, the creep recovery strain rate refers to the strain rate compared to the initial adhesive layer when an external force is applied to the adhesive layer including the resin composition for a period of time and then is removed for a period of time.

In an embodiment, the modified (meth)acrylic-urethane oligomer may include an alicyclic group. Here, the alicyclic group may refer to a saturated aliphatic ring that does not include an ethylenically unsaturated group. For example, the alicyclic group may include a $C_3$-$C_{10}$ cycloalkyl group, e.g., s cyclopentane group, a cyclohexane group, and the like.

In an embodiment, the modified (meth)acrylic-urethane oligomer may be a copolymer of (or derived from) an alicyclic group-containing diisocyanate-based monomer and a glycol-based diol monomer. Here, the copolymer may include a block copolymer, an alternating copolymer, a random copolymer, and the like.

In an embodiment, the alicyclic group-containing diisocyanate-based monomer may include isophorone diisocyanate, and the glycol-based diol monomer may include polypropylene glycol.

In an embodiment, the modified (meth)acrylic-urethane oligomer may have a weight average molecular weight (Mw) of, for example, greater than or equal to 30,000 g/mol, greater than or equal to 31,000 g/mol, greater than or equal to 32,000 g/mol, greater than or equal to 33,000 g/mol, greater than or equal to 34,000 g/mol, or greater than or equal to 35,000 g/mol. For example, the modified (meth)acrylic-urethane oligomer may have a weight average molecular weight Mw in a range of, for example, about 25,000 g/mol to about 100,000 g/mol, about 30,000 g/mol to about 70,000 g/mol, or about 30,000 g/mol to about 50,000 g/mol.

In an embodiment, the modified (meth)acrylic-urethane oligomer may have a glass transition temperature (Tg) of, for example, less than or equal to −35° C., less than or equal to −36° C., less than or equal to −37° C., less than or equal to −38° C., less than or equal to −39° C., less than or equal to −40° C., less than or equal to −41° C., less than or equal to −42° C., or less than or equal to −43° C. For example, the modified (meth)acrylic-urethane oligomer may have a glass transition temperature Tg in a range of about −53° C. to about −33° C., about −50° C. to about −37° C., or about −50° C. to about −40° C.

In an embodiment, the modified (meth)acrylic-urethane oligomer may be included, based on a total of 100 parts by weight of the resin composition, in an amount in a range of about 5 parts by weight to about 15 parts by weight, for example, about 7 parts by weight to about 13 parts by weight, or about 8 parts by weight to about 13 parts by weight.

In an embodiment, the photopolymerizable monomer may include a monofunctional (meth)acrylate, a polyfunctional (meth)acrylate including two or more acrylic groups, or a combination thereof. For example, the photopolymerizable monomer may include a monofunctional (meth)acrylate and polyfunctional (meth)acrylate including two acrylic groups.

In an embodiment, the monofunctional (meth)acrylate may include a polar group-containing monofunctional (meth)acrylate and monofunctional (meta)acrylate without a polar group.

For example, the polar group-containing monofunctional (meth)acrylate may include, as a polar group, a hydroxy group, an amine group, and/or a carboxylic group. For example, the polar group may include a hydroxy group, and the monofunctional(meth)acrylate including a hydroxy group as a polar group may include 2-hydroxyethyl(meth) acrylate, 2-hydroxypropyl(meth)acrylate, 4-hydroxybutyl (meth)acrylate, 2-hydroxy-3-phenoxypropyl(meth)acrylate, or a combination thereof. However, embodiments of the present disclosure are not limited thereto.

For example, monofunctional (meth)acrylate without a polar group may have a structure represented by Formula 2:

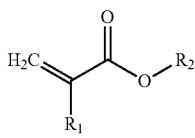

Formula 2 wherein, in Formula 2, $R_1$ may be hydrogen or a methyl group, and $R_2$ may be a $C_1$-$C_{20}$ alkyl group, a $C_3$-$C_{10}$ cycloalkyl group, or a $C_3$-$C_{10}$ cycloalkyl group substituted with at least one $C_1$-$C_{20}$ alkyl group.

For example, the monofunctional (meta)acrylate without a polar group may include methyl(meth)acrylate, ethyl (meth)acrylate, n-propyl(meth)acrylate, isopropyl(meth) acrylate, 1-ethylpropyl(meth)acrylate, 2-ethylpropyl(meth) acrylate, n-butyl(meth)acrylate, sec-butyl(meth)acrylate, isobutyl(meth)acrylate, tert-butyl(meth)acrylate, 1-ethyl-butyl(meth)acrylate, 2-ethylbutyl(meth)acrylate, 3-ethyl-butyl(meth)acrylate, n-pentyl(meth)acrylate, tert-pentyl (meth)acrylate, neopentyl(meth)acrylate, isopentyl(meth) acrylate, sec-pentyl(meth)acrylate, 3-pentyl(meth)acrylate, sec-isopentyl(meth)acrylate, 1-ethylpentyl(meth)acrylate, 2-ethylpentyl(meth)acrylate, 3-ethylpentyl(meth)acrylate, 4-ethylpentyl(meth)acrylate, n-hexyl(meth)acrylate, isohex-yl(meth)acrylate, sec-hexyl(meth)acrylate, tert-hexyl(meth) acrylate, 1-ethylhexyl(meth)acrylate, 2-ethylhexyl(meth) acrylate, 3-ethylhexyl(meth)acrylate, 4-ethylhexyl(meth) acrylate, 5-ethylhexyl(meth)acrylate, n-heptyl(meth) acrylate, isoheptyl(meth)acrylate, sec-heptyl(meth)acrylate, tert-heptyl(meth)acrylate, 1-ethylheptyl(meta)acrylate, 2-ethylheptyl(meth)acrylate, 3-ethylheptyl(meth)acrylate, 4-ethylheptyl(meth)acrylate, 5-ethylheptyl(meth)acrylate, 6-ethylheptyl(meth)acrylate, 7-ethylheptyl(meth)acrylate, n-octyl(meth)acrylate, isooctyl(meth)acrylate, sec-octyl (meth)acrylate, tert-octyl(meth)acrylate, 1-ethyloctyl(meth) acrylate, 2-ethyloctyl(meth)acrylate, 3-ethyloctyl(meth) acrylate, 4-ethyloctyl(meth)acrylate, 5-ethyloctyl(meth) acrylate, 6-ethyloctyl(meth)acrylate, 7-ethyloctyl(meth) acrylate, n-nonyl(meth)acrylate, isononyl(meth)acrylate, sec-nonyl(meth)acrylate, tert-nonyl(meth)acrylate, 1-ethyl-nonyl(meth)acrylate, 2-ethylnonyl(meth)acrylate, 3-ethyl-nonyl(meth)acrylate, 4-ethylnonyl(meth)acrylate, 5-ethyl-nonyl(meth)acrylate, 6-ethylnonyl(meth)acrylate, 7-ethylnonyl(meth)acrylate, 8-ethylnonyl(meth)acrylate, n-decyl(meth)acrylate, isodecyl(meth)acrylate, sec-decyl (meth)acrylate, tert-decyl(meth)acrylate, 1-ethyldecyl (meth)acrylate, 2-ethyldecyl(meth)acrylate, 3-ethyldecyl (meth)acrylate, 4-ethyldecyl(meth)acrylate, 5-ethyldecyl (meth)acrylate, 6-ethyldecyl(meth)acrylate, 7-ethyldecyl (meth)acrylate, or 8-ethyldecyl(meth)acrylate, cyclohexyl (meth)acrylate, isobornyl(meth)acrylate, adamantyl(meth) acrylate, or a combination thereof.

In an embodiment, the polyfunctional (meta)acrylate may have a structure represented by Formula 3:

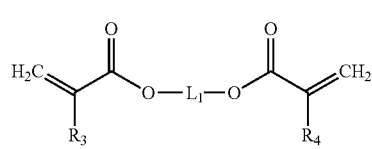

Formula 3 wherein, in Formula 3,
$R_3$ and $R_4$ may each independently be hydrogen or a methyl group, and $L_1$ may be a $C_1$-$C_{20}$ alkylene group, a $C_3$-$C_{10}$ cycloalkylene group, a $C_1$-$C_{20}$ alkylene group substituted with at least one $C_1$-$C_{20}$ alkyl group, or a $C_3$-$C_{10}$ cycloalkylene group substituted with at least one $C_1$-$C_{20}$ alkyl group.

For example, the polyfunctional (meth)acrylate may include methanediol di(meth)acrylate, 1,2-ethandiol di(me-th)acrylate, 1,3-propanediol di(meth)acrylate, 1,4-butane-diol di(meth)acrylate, 1,5-pentanediol di(meth)acrylate, 1,6-hexanediol di(meth)acrylate, 1,7-heptanediol di(meth) acrylate, 1,8-octanediol di(meth)acrylate, 1,9-nonanediol di(meth)acrylate, 1,10-decanediol di(meth)acrylate, or a combination thereof.

In an embodiment, the photopolymerizable monomer may include, based on a total of 100 parts by weight of the resin composition, a polar group-containing monofunctional (meth)acrylate in a range of about 20 parts by weight to about 30 parts by weight, a monofunctional (meth)acrylate without a polar group in a range of about 55 parts by weight to about 70 parts by weight, and a polyfunctional (meth) acrylate including two or more acrylic groups in a range of about 0.1 part by weight to about 2.0 parts by weight.

For example, the polar group-containing monofunctional (meth)acrylate may be included in an amount in a range of about 22 parts by weight to about 28 parts by weight, about 23 parts by weight to about 25 parts by weight, or about 24 parts by weight to about 24.5 parts by weight, based on a total of 100 parts by weight of the resin composition.

For example, the monofunctional (meth)acrylate without a polar group may be included in an amount in a range of about 57 parts by weight to about 68 parts by weight, about 60 parts by weight to about 65 parts by weight, or about 61 parts by weight to about 64 parts by weight, based on a total of 100 parts by weight of the resin composition.

For example, the polyfunctional (meth)acrylate including two or more acrylic groups may be included in an amount in a range of about 0.1 part by weight to about 1.5 parts by weight, about 0.2 part by weight to about 1.0 part by weight, or about 0.25 part by weight to about 1.0 part by weight, based on a total of 100 parts by weight of the resin composition.

In an embodiment, the photoinitiator may include a ben-zophenone-based compound, an anthraquinone-based com-pound, a benzoin-based compound, an acetophenone-based compound, an α-aminoalkylphenone-based compound, an acylphosphine oxide-based compound, or a mixture thereof.

For example, the benzophenone-based compound may include 2-hydroxybenzophenone, 3-hydroxybenzophenone, 4-hydroxybenzophenone, 2-hydroxymethylbenzophenone, 3-hydroxymethylbenzophenone, 4-hydroxymethylbenzophenone 2-hydroxyethylbenzophenone, 3-hydroxyethylbenzophenone, 4-hydroxyethylbenzophenone, 3-(1-hydroxyethyl)benzophenone, 4-(1-hydroxyethyl)benzophenone, or a combination thereof.

For example, the anthraquinone-based compound may include 9,10-anthraquinone, 1-chloroanthraquinone, 2-chloroanthraquinone, octamethylanthraquinone, 1,2-benzanthraquinone, or a combination thereof.

For example, the benzoin-based compound may include benzoin, benzoin ethyl ether, benzoin methyl ether, benzoyl propyl ether, t-butyl benzoyl ether, or a combination thereof.

For example, the acetophenone-based compound may include benzophenone, p-(dimethylamino)benzophenone, 2,2-dichloro-4-phenoxyacetophenone, 4,4-bisdiethylaminobenzophenone, 2,2-diethoxyacetophenone, 2,2-dibutoxyacetophenone, 2-hydroxy-2-methylpropylphenone, or a combination thereof.

For example, the α-aminoalkylphenone-based compound may include 2-methyl-(4-methylthio)phenyl-2-morpholino-1-propane-1-one (IRGACURE907), 2-benzyl-2-dimethylamino-1-(4-morpholinophenyl)-butane-1-one (IRGACURE369), or a combination thereof.

For example, the acylphosphine oxide-based compound may include benzoyldiphenylphosphine oxide, 2,4,6-trimethylbenzoyldiphenylphosphine oxide, benzoyldiethoxyphosphine oxide, 2,4,6-trimethylbenzoyldimethoxyphenylphosphine oxide, 2,4,6-trimethylbenzoyldiethoxyphenylphosphine oxide, or a combination thereof.

The photoinitiator may be included, based on a total of 100 parts by weight of the oligomer and the photopolymerizable monomer in the resin composition, in an amount in a range of about 5 parts by weight to about 15 parts by weight.

The photoinitiator may be used by mixing with a sensitizer, a curing accelerator, or the like known in the art, as needed.

In an embodiment, the resin composition may include, based on a total of 100 parts by weight of the resin composition, the modified (meth)acrylic-urethane oligomer in a range of about 5 parts by weight to about 15 parts by weight, the polar group-containing monofunctional (meth)acrylate in a range of about 20 parts by weight to 30 parts by weight, the monofunctional (meth)acrylate without a polar group about 55 parts by weight to about 70 parts by weight, the polyfunctional (meth)acrylate including two or more acrylic groups in a range of about 0.1 part by weight to about 2.0 parts by weight, and the photoinitiator in a range of about 5 parts by weight to about 15 parts by weight.

In an embodiment, the resin composition may be viscosity in a range of about 18 cps to about 20 cps at 25° C.

In an embodiment, the resin composition may have density in a range of about 0.091 g/cm$^3$ to about 0.95 g/cm$^3$ at 25° C.

In an embodiment, the resin composition may have surface tension in a range of about 26 millinewtons per meter (mN/m) to about 28 mN/m at 25° C.

By using the resin composition having viscosity in a range of about 18 cps to about 20 cps at 25° C., density in a range of about 0.091 g/cm$^3$ to about 0.95 g/cm$^3$ at 25° C., and surface tension in a range of about 26 mN/m to about 28 mN/m at 25° C., the resin composition may be provided with a printing process, e.g., an ink-jet printing process, between a display panel and a cover window which will be described below. Accordingly, a large area display may be more easily manufactured.

Another aspect of the present disclosure provides a photocurable adhesive including a resin composition that includes a modified (meth)acrylic-urethane oligomer having a weight average molecular weight (Mw) of greater than or equal to 25,000 g/mol and a glass transition temperature (Tg) of less than or equal to −30° C., a photopolymerizable monomer, and a photoinitiator.

Here, the resin composition may be the same as defined above.

The photocurable adhesive may further include a tackifying resin as needed. For use as the tackifying resin, a conventional tackifying resin may be used, and examples thereof are: a resin having a polar group such as a rosin ester resin, a phenol resin, a xylene resin, a xylenephenol resin, a terpenephenol resin, etc.; various petroleum resins such as an aromatic resin having relatively small polarity, an aliphatic-aromatic copolymer-based resin, an alicyclic-based resin, etc.; a coumarone resin, a low-molecular weight polyethylene resin, a terpene resin, and a resin which hydrogenated these.

The photocurable adhesive may be, as needed, used in combination with various additives, such as an extender, a plasticizer, a moisture absorbent, a condensation reaction promoting catalyst, a photosensitizer, a photopolymerization accelerator, a curing catalyst, a physical property modifier for improving tensile properties or the like, a reinforcing agent, a colorant, a flame retardant, a flow inhibitor, an antioxidant, an antiaging agent, a ultraviolet absorber, a solvent, a fragrant agent, a pigment, a dye, a filler, a diluent, a polymerization inhibitor, a solid polymer, and the like.

Another aspect of the present disclosure provides a display apparatus including: a display panel; a cover window arranged on the display panel; and a photocurable adhesive layer arranged between the display panel and the cover window, wherein the photocurable adhesive layer includes a modified (meth)acrylic-urethane oligomer having a weight average molecular weight Mw of greater than or equal to 25,000 g/mol and a glass transition temperature Tg of less than or equal to −30° C., a photopolymerizable monomer, and a photoinitiator.

In an embodiment, the display apparatus may be a foldable display apparatus.

Here, the photocurable adhesive layer of the display apparatus may include the same resin composition as described above, and a detailed description thereof is provided above.

Hereinafter, embodiments of the present disclosure will be described in detail with reference to the accompanying drawings. The same or corresponding components will be denoted by the same reference numerals, and thus redundant description thereof will be omitted.

Figure 2:
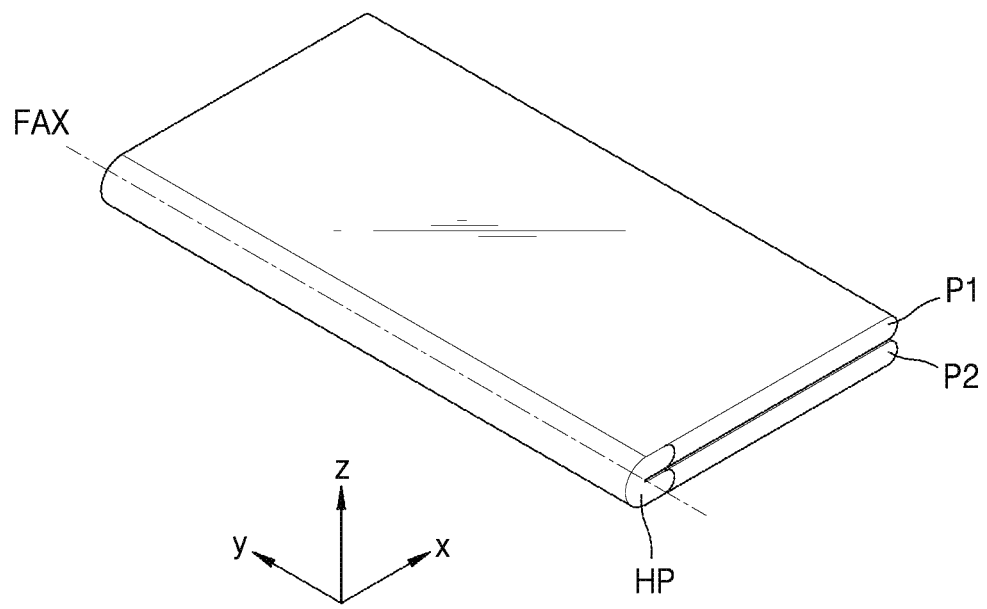

FIGS. 1 and 2 are perspective views each schematically illustrating a portion of a display apparatus according to an embodiment of the present disclosure. In detail, FIG. 1 illustrates a display apparatus 1 in an unfolded state, whereas FIG. 2 illustrates a display apparatus 1 in a folded state.

Referring to FIGS. 1 and 2, the display apparatus 1 includes a low cover LC, a display panel DP, and a cover window CW.

The low cover LC may include a first portion P1 and a second portion P2 that support the display panel DP. The low cover LC may be folded around a folding axis FAX defined between the first portion P1 and the second portion P2. In an embodiment, the low cover may further include a hinge portion HP, which may be provided between the first portion P1 and the second portion P2.

The display panel DP may include a display area DA. The display panel DP may provide an image through an array of a plurality of pixels PXs arranged in the display area DA. Each of the plurality of pixels PX may be defined as an emission zone in which light is emitting by a light-emitting element that is electrically connected to a pixel circuit. In an embodiment, each of the plurality of pixels PX may emit red light, green light, or blue light. In one or more embodiments, each of the plurality of pixels PX may emit red light, green light, blue light, or white light.

For example, the light-emitting element included in the display panel DP may include an organic light-emitting diode, an inorganic light-emitting diode, a micro light-emitting diode, and/or a quantum dot light-emitting diode. Hereinafter, for convenience of explanation, a case in which the light-emitting element included in the display panel DP includes an organic light-emitting diode will be mainly described, but the following description is not limited thereto, and the same applies even when other types of light-emitting elements are provided.

The display area DA may include a first display area DA1 and a second display area DA2 that are arranged on both sides of the display panel DP around the folding axis FAX that transverses the display area DA. The first display area DA1 and the second display area DA2 may be arranged on the first part P1 and the second part P1 of the low cover LC, respectively. The display panel DP may provide a first image and a second image by using light emitted from the plurality of pixels PX arranged on the first display area DA1 and the second display area DA2. In an embodiment, the first image and the second image may be portions of any one image provided through the display area DA of the display panel DP. In one or more embodiments, the first image and the second image may each independently be provided by the display panel DP.

The display panel DP may be folded around the folding axis FAX. When the display panel DP is folded, the first display area DA1 and the second display area DA2 of the display panel DP may face each other.

FIGS. 1 and 2 illustrate a case where the folding axis FAX extends in the y-direction, but embodiments of the present disclosure are not limited thereto. In an embodiment, the folding axis FAX may extend in the x direction intersecting the y direction. In one or more embodiments, the folding axis FAX on the xy plane may also extend in a direction crossing the x direction and the y direction.

FIGS. 1 and 2 illustrate a case where only one folding axis FAX exists, but embodiments of the present disclosure are not limited thereto. In an embodiment, the display panel DP may be folded multiple times around a plurality of folding axes FAX transversing the display area DA.

The cover window CW may be arranged on the display panel DP for coverage. The cover window CW may be folded or bent according to an external force without occurrence of cracks or the like following repeated folding and unfolding of the display panel DP. When the display panel DP is folded around the folding axis FAX, the cover window CW may be also folded together.

Figure 3A:
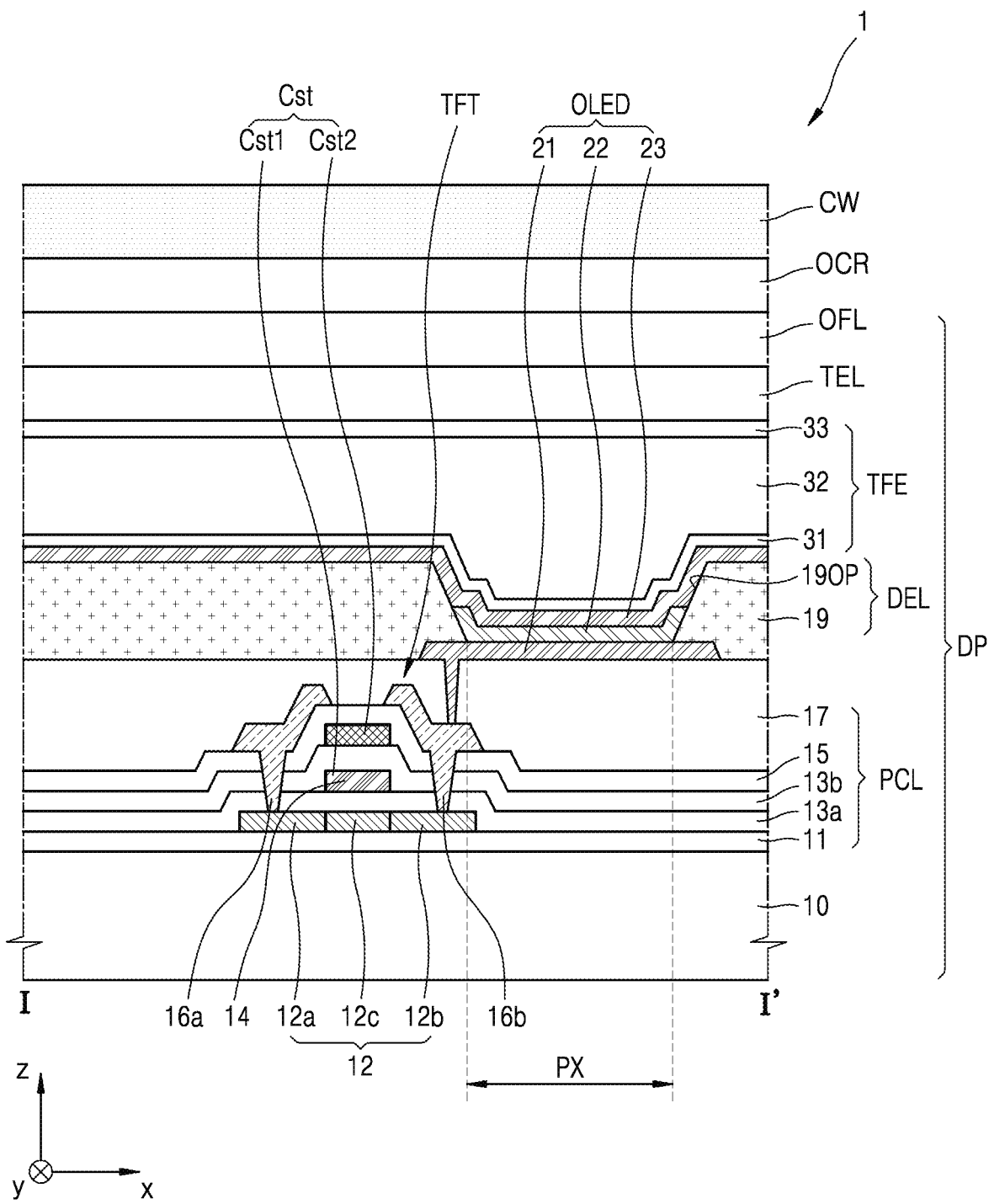
FIG. 3A is a perspective view schematically illustrating a portion of a display apparatus according to an embodiment of the present disclosure.
Figure 3B:
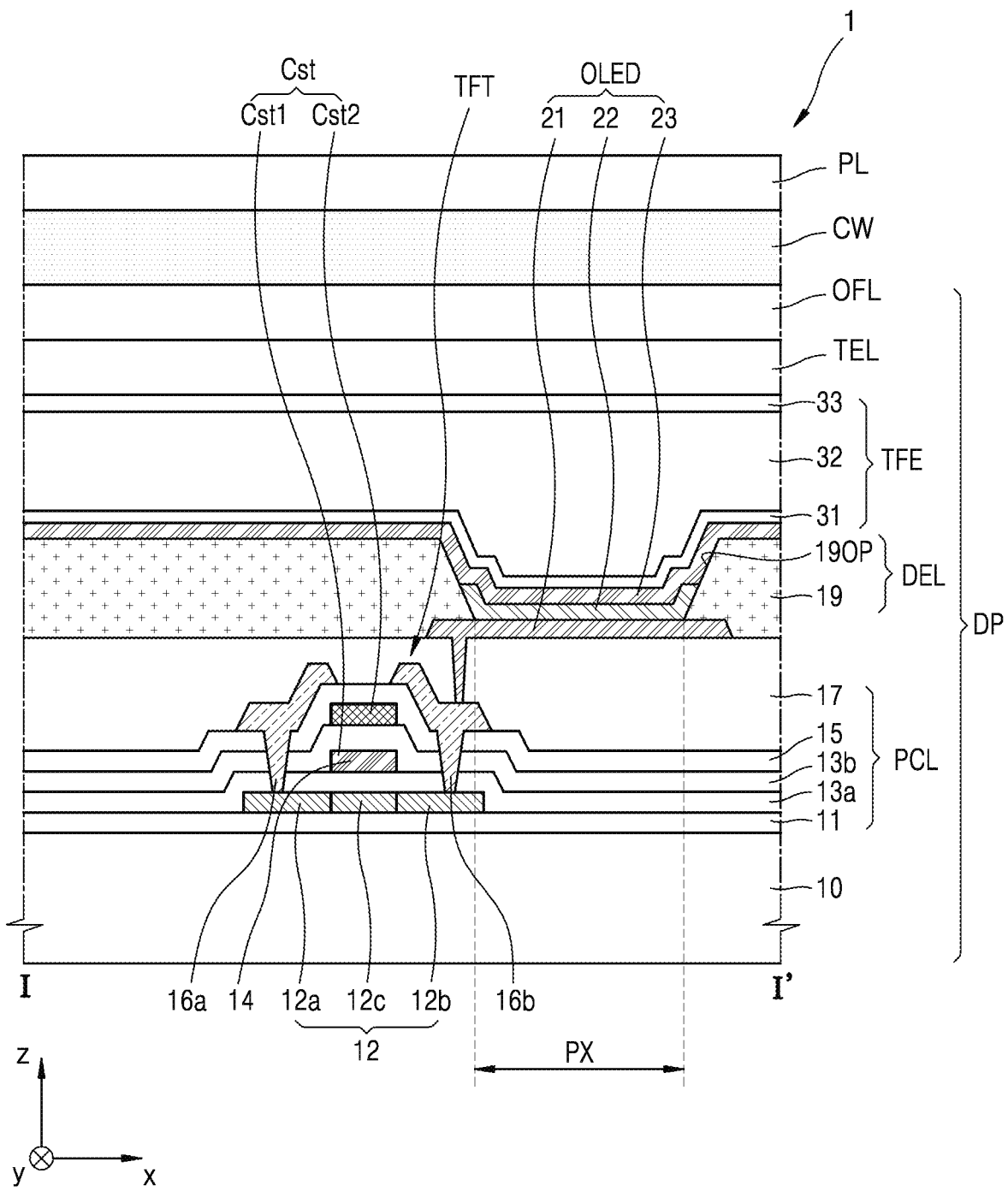
FIG. 3B is a perspective view schematically illustrating a portion of a display apparatus according to another embodiment of the present disclosure.

FIG. 3A is a cross-sectional view schematically illustrating a portion of a display device according to an embodiment of the present invention, and FIG. 3B is a cross-sectional view schematically illustrating a part of a display device according to another embodiment of the present invention. FIGS. 3A and 3B may correspond to cross-sectional views of the display apparatus taken along line I-I' of FIG. 1.

Referring to FIGS. 3A and 3B, the display panel DP may have a stacked structure of a substrate 10, a pixel circuit layer PCL, a display element layer DEL, a thin-film encapsulation layer TFE, a touch electrode layer TEL, and an optical functional layer OFL.

The substrate 10 may be formed of glass or a polymer resin. Here, the polymer resin may include at least one of a polyethersulfone, a polyarylate, a polyether imide, a polyethylene naphthalate, a polyethylene terephthalate, a polyphenylene sulfide, a polyimide, a polycarbonate, a cellulose tri acetate, a cellulose acetate propionate, and the like.

The pixel circuit layer PCL may be arranged on the substrate 10. FIGS. 3A and 3B illustrates the pixel circuit layer PCL including: thin-film transistor TFT; and a buffer layer 11, a first insulating layer 13a, a second insulating layer 13b, a third insulating layer 15, and a planarization layer 17 that are arranged under and/or above the thin-film transistor TFT components.

The buffer layer 11 may reduce or block penetration of a foreign substance, moisture, or external air from the bottom of the substrate 10, and accordingly may provide a flat surface on the substrate 10. The buffer layer 11 may include an inorganic insulating material, such as silicon nitride, silicon oxynitride, and silicon oxide, and may be single-layered or multi-layered including the inorganic insulating material.

The thin-film transistor TFT on the buffer layer 11 may include a semiconductor layer 12, which may include polysilicon. In an embodiment, the semiconductor layer 12 may include amorphous silicon, an oxide semiconductor, an organic semiconductor, or the like. The semiconductor layer 12 may cover a channel region 12c and a drain region 12a and a source region 12 that are located at both ends of the channel region 12c. The gate electrode 14 may overlap the channel region 12c.

The gate electrode 14 may include a low-resistance metal material. The gate electrode 14 may include a conductive material including molybdenum (Mo), aluminum (Al), copper (Cu), titanium (Ti), or the like, and may be multi-layered or single-layered consisting of the conductive material.

A first insulating layer 13a may be arranged between the semiconductor layer 12 and the gate electrode 14. The first insulating layer 13a may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like.

A second insulating layer 13b may be provided to cover the gate electrode 14. The second insulating layer 13b may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like.

An upper electrode Cst1 of a storage capacitor Cst may be arranged on the second insulating layer 13b. The upper electrode Cst2 may at least partially overlap the gate electrode 14 arranged under the upper electrode Cst2. The gate electrode 14 and the upper electrode Cst2 that overlap each other with the second insulating layer 13b that is interposed therebetween may form the storage capacitor Cst. That is, the gate electrode 14 may function as a bottom electrode Cst1 of the storage capacitor Cst.

As such, the storage capacitor Cst and the thin-film transistor TFT may overlap each other. In an embodiment, the storage capacitor Cst and the thin-film transistor TFT may not overlap each other. That is, the bottom electrode Cst1 of the storage capacitor Cst is a separate component from the gate electrode 14 and may be formed to be spaced apart from the gate electrode 14.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be single-layered or multi-layered including the element above.

The third insulating layer 15 may cover the upper electrode Cst2. The third insulating layer 15 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like. The third insulating layer 15 may be single-layered or multi-layered including the inorganic insulating material above.

The drain electrode 16a and the source electrode 16b may respectively arranged on the third insulating layer 15. The drain electrode 16a and the source electrode 16b may be linked to a drain region 12a and a source region 12b, respectively, through contact holes in the insulating layers at the bottom. The drain electrode 16a and the source electrode 16b may include a material having good conductivity. The drain electrode 16b and the source electrode 16b may include a conductive material including Mo, Al, Cu, Ti, or the like, and may be multi-layered or single-layered. In an embodiment, the drain electrode 16a and the source electrode 16b may have a multi-layered of Ti/Al/Ti.

A planarization layer 17 may include an organic insulating material. Examples of the organic insulating material included in the planarization layer 17 are a general-purpose polymer, such as polymethylmethacrylate (PMMA) or polystyrene (PS), a polymer derivative including a phenol-based group, an acryl-based polymer, an imide-based polymer, an arylether-based polymer, an amid-based polymer, a fluorine-based polymer, a p-xylene-based polymer, a vinyl alcohol-based polymer, and a blend thereof.

A display element layer DEL may be arranged on the pixel circuit layer PCL having the structure above. The display element layer DEL may include an organic light-emitting diode (OLED) as a light-emitting device, and the organic light-emitting diode OLED may have a stacked structure including a first electrode 21, an emission layer 22, and a second electrode 23. In the organic light-emitting diode OLED, the first electrode 21 may be electrically connected to the thin-film transistor TFT through the contact holes defined in the planarization layer 17.

The first electrode 21 may include a conductive oxide, such as indium tin oxide (ITO), indium zinc oxide (IZO), zinc oxide (ZnO), indium oxide) ($In_2O_3$), indium gallium oxide (IGO), or aluminum zinc oxide (AZO). In an embodiment, the first electrode 21 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In one or more embodiments, the first electrode 21 may further include, on/under the reflective film, a film formed of ITO, IZO, ZnO, or $In_2O_3$.

A pixel-defining layer 19 having an opening 19OP exposing at least a portion of the first electrode 21 may be located on the first electrode 21. The pixel-defining layer 19 may include an organic insulating material and/or an inorganic insulating material. The opening 19OP may define an emission region of light emitted from the organic light-emitting diode OLED. For example, the size/width of the opening 19OP may correspond to the size/width of the emission region. Therefore, the size/width of the pixel PX may depend on the size/width of the corresponding opening 19OP of the pixel-defining layer 19.

An emission layer 22 may be arranged on the opening 19OP of the pixel-defining layer 19. The emission layer 22 may include a high-molecular weight organic material or a low-molecular weight organic material, each of which emits light of a predetermined color. In an embodiment, the emission layer 22 may include an inorganic light-emitting material or a quantum dot.

Although not shown in FIGS. 3A and 3B, a first functional layer and a second functional layer may be disposed on and under the emission layer 22, respectively. The first functional layer may include, for example, a hole transport layer or both a hole transport layer and a hole injection layer. The second functional layer may include an electron transport layer and/or an electron injection layer. However, embodiments of the present disclosure are not limited thereto. The first functional layer and the second functional layer may selectively be arranged on and under the emission layer 22, respectively.

The first functional layer and/or the second functional layer may be a common layer formed to completely cover the substrate 10 in the same manner as in the second functional layer to be described later.

The second electrode 23 may be located on the first electrode 21, and may overlap the first electrode 21. The second electrode 23 may be formed of a conductive material having low work function. For example, the second electrode 23 may include a (semi)transparent film including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In one or more embodiments, a layer formed of ITO, IZO, ZnO, or $In_2O_3$ may be further located on the (semi)transparent layer including the material above. The second electrode 23 may be integrally formed to cover the entire substrate 10.

An encapsulation portion may be located on the display element layer DEL. In an embodiment, the encapsulation portion may be provided as a thin-film encapsulation layer TFE. The thin-film encapsulation layer TFE may be located on the display element layer DEL for coverage. The thin-film encapsulation layer TFE may include at least one inorganic encapsulation layer and at least one organic encapsulation layer. In an embodiment, the thin-film encapsulation layer TFE may include a first inorganic encapsulation layer 31, an organic encapsulation layer 32, and a second inorganic encapsulation layer 33 that are sequentially stacked. In one or more embodiments, the encapsulation portion may be provided as an encapsulation substrate.

The first inorganic encapsulation layer 31 and the second inorganic encapsulation layer 33 may include one or more inorganic material selected from aluminum oxide, titanium oxide, tantalum oxide, hafnium oxide, zinc oxide, silicon oxide, silicon nitride, and silicon oxynitride. The organic encapsulation layer 32 may include a polymer-based material. Examples of the polymer-based material are an acryl-based resin, an epoxy-based resin, polyimide, polyethylene, and the like. In an embodiment, the organic encapsulation layer 32 may include acrylate. The organic encapsulation layer 32 may be formed by curing a monomer or coating a polymer.

A touch electrode layer TEL including touch electrodes may be located on the thin-film encapsulation layer TFE, and an optical function layer OFL may be located on the thin-film encapsulation layer TFE. The touch electrode layer TEL may obtain coordinate information according to an external input, for example, a touch event. The optical function layer OFL may reduce reflectance of light (external light) incident from the display apparatus 1 and may improve color purity of light emitting from the display apparatus 1.

In an embodiment, the optical function layer OFL may include a phase retarder and/or a polarizer. The phase retarder may be a film type or a liquid crystal coating type, and may include a A/2 phase retarder and/or a A/4 phase retarder. The polarizer may also be a film type or a liquid crystal coating type. The film type may include a stretched synthetic resin film, and the liquid crystal coating type may include liquid crystals arranged in a predetermined arrangement. The phase retarder and the polarizer may further include a protective film.

In an embodiment, the optical function layer OFL may include a destructive interference structure. The destructive interference structure may include a first reflective layer and a second reflective layer that are arranged on different layers. First reflected light and second reflected light respectively reflected from the first reflective layer and the second reflective layer may destructively interfere, and accordingly, external light reflectance may be reduced.

An adhesive member may be located between the touch electrode layer TEL and the optical function layer OFL. The adhesive member may include a photocurable adhesive layer (not shown) including the resin composition.

A cover window CW may be located on a display panel DP. The cover window CW may be adhered to the display panel DP by the adhesive member. The adhesive member may include a photocurable adhesive layer (not shown) including the resin composition.

The cover window CW may have high transmittance to transmit light emitted from the display panel DP. In an embodiment, the cover window CW may have transmittance of greater than or equal to 85% and transmission haze of less than or equal to 2%. However, embodiments of the present disclosure are not limited thereto.

In addition, the cover window CW may be thin to minimize the weight of the display apparatus 1 and may have strong strength and hardness to protect the display panel DP from external impact.

The optical function layer OFL may be located between the cover window CW and the touch electrode layer TEL, and the adhesive member may be located between the optical function layer OFL and the cover window CW. The adhesive member may include a photocurable adhesive layer (OCR) including the resin composition.

In an embodiment, as shown in FIG. 3B, a protective layer PL may be located on the cover window CW. The protective layer PL may serve to cover and protect the cover window CW. The protective layer PL may include a hard coating layer and one or more of transparent synthetic resins selected from polyethylene terephthalate (PET), polypropylene (PP), polystyrene (PP), polyimide (PI), and the like, and may include a hard coating layer. In addition, between the protective layer PL and the cover window CW, the adhesive member, for example, the photocurable adhesive layer (not shown) including the resin composition may be located. In one or more embodiments, as shown in FIG. 3A, the protective layer PL may be omitted. In this case, the outermost surface of the display apparatus 1 may be provided as the cover window CW to improve the glass texture.

The photocurable adhesive layer (OCR) according to an embodiment may include the resin composition, and a method of preparing the photocurable adhesive layer OCR may be easily performed by those skilled in the art with reference to Synthesis Examples and/or Examples.

EXAMPLES

Example 1

11.7 parts by weight of copolymer (Mw=35,000, Tg=−43° C.) of polypropylene glycol and isophorone diisocyanate, 24.4 parts by weight of 4-hydroxybutylacrylate, 63.5 parts by weight of 2-ethylhexylacrylate, 0.29 parts by weight of 1,9-nonanediol diacrylate, and 0.11 parts by weight of 2,4,6-trimethylbenzoyl diphenylphosphine oxide were mixed to obtain a resin composition (100 parts).

Comparative Example 1

2.5 parts by weight of copolymer (Mw=10,000, Tg=−44° C.) of polypropylene glycol and isophorone diisocyanate, 7.4 parts by weight of copolymer (Mw=38,000, Tg=−6° C.) of polypropylene glycol and isophorone diisocyanate, 24.6 wt % of 4-hydroxybutylacrylate, 63.9 parts by weight of 2-ethylhexylacrylate, 0.2 parts by weight of 1,9-nonanediol diacrylate, and 1.4 parts by weight of 2,4,6-trimethylbenzoyl diphenyl phosphineoxide were mixed to obtain a resin composition (100 parts).

Evaluation Example 1: Evaluation of Physical Properties of Resin Composition

To confirm whether the resin composition prepared in Example 1 had properties suitable for use in an inkjet printing process, viscosity, density, and surface tension were measured by the following methods, and results are listed in Tables 1 to 3.

Measuring Method
- Viscosity: Viscosity was measured by using an E-type viscometer as temperature is increased from 5° C. to 25° C.
- Density: Density was measured at 25° C. and 55° C. for cured products of the resin composition
- Surface tension: Surface tension was measured for the resin composition by using a digital tensiometer K9 manufactured by KRUSS (Germany).

TABLE 1

| | Example 1 | | | | | | |
|---|---|---|---|---|---|---|---|
| Temperature (° C.) | 25 | 30 | 35 | 40 | 45 | 50 | 55 |
| Viscosity (cps) | 19.6 | 16.9 | 14.8 | 13 | 11.5 | 10.3 | 9.3 |

TABLE 2

| | Example 1 | |
|---|---|---|
| Temperature (° C.) | 25 | 55 |
| Density (g/cm$^3$) | 0.933 | 0.907 |

TABLE 3

| | Example 1 | |
|---|---|---|
| Temperature (° C.) | 25 | 55 |
| Surface tension (mN/m) | 27.7 | 25.5 |

Considering the viscosity, density, and surface tension measured in Tables 1 to 3, it was confirmed that the resin composition of Example 1 had properties suitable for use in an inkjet printing process.

Evaluation Example 2: Creep/Recovery Evaluation

The cured products obtained by UV curing each of the resin composition prepared in Example 1 and Comparative Example 1 were cut into a specimen size having a diameter of 8 mm and a thickness of 500 μm. Afterwards, each sample specimen was subjected to a process of twisting for 600 seconds with a force of 2,000 Pa and then untwisting the twist for 600 seconds under the following different temperatures-20° C., 25° C., and 60° C.

Figure 4:
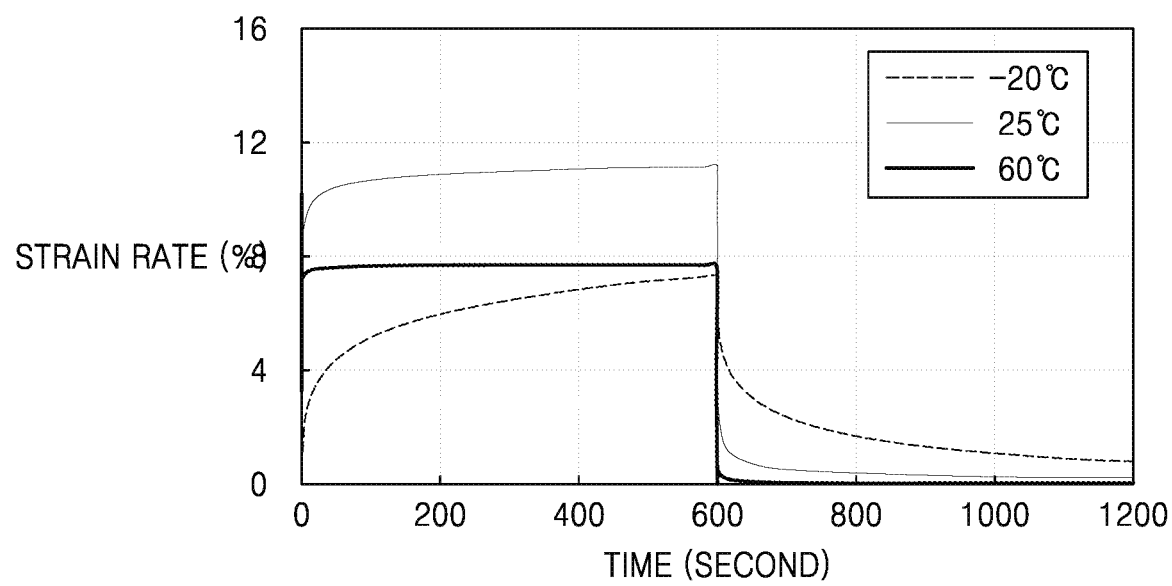
FIG. 4 is a graph showing a distortion rate with respect to creep/recovery time for UV cured products of resin compositions of Example 1 and Comparative Example 1.

While performing a process of twisting and untwisting at each temperature, the creep strain rates at 600 seconds and the recovery strain rates at 1,200 seconds were determined and listed in Table 4, and the time-dependent strain amounts are shown in the graph of FIG. 4.

TABLE 4

| Temperature | Comparative Example 1 Creep/recovery strain rate (%) | Example 1 Creep/recovery strain rate (%) |
|---|---|---|
| −20° C. | 9.9/1.6 | 7.4/0.9 |
| 25° C. | 14.9/0.3 | 11.2/0.3 |
| 60° C. | 10.4/0.03 | 7.7/0.05 |

Referring to Table 4 and FIG. 4, since the UV cured product of the resin composition of Example 1 maintained the creep/recovery strain rate at less than or equal to 1.0% even at −20° C., it was confirmed that the resin composition of Example 1 had excellent adhesion retention properties at low temperatures.

Evaluation Example 3: Creep/Recovery Evaluation

The cured products obtained by UV curing each of the resin composition prepared in Example 1 and Comparative Example 1 were cut into a specimen size having a diameter of 8 mm and a thickness of 500 μm. Afterwards, each sample specimen was subjected to a process of twisting for 1 second with a force of 2,000 Pa and then untwisting the twist for 1 second under the following temperatures −20° C., 25° C., and 60° C., repeatedly 300 times for each.

Figure 5:
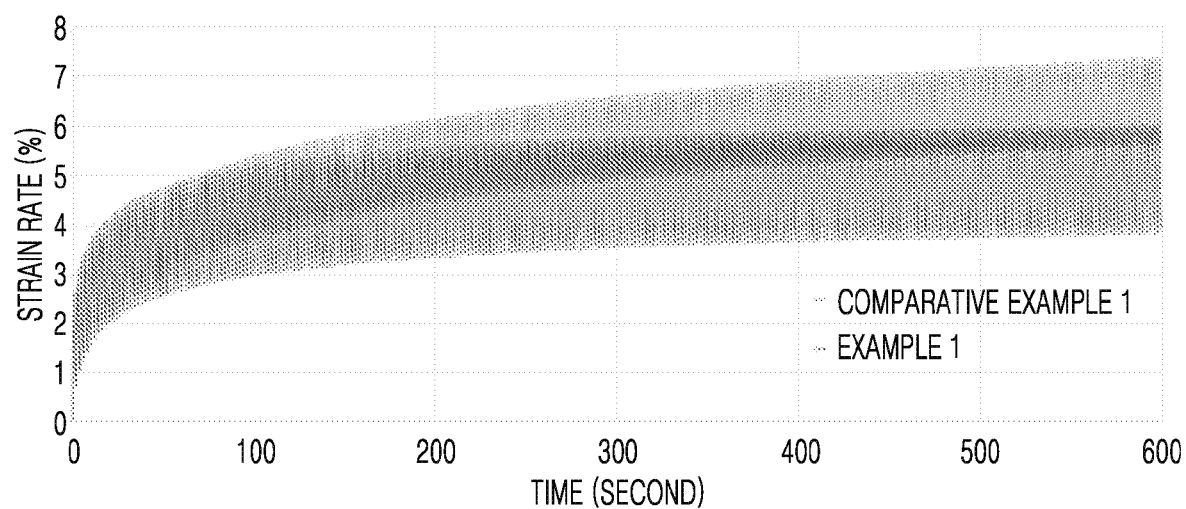
FIG. 5 is a graph showing a distortion rate with respect to repeated creep/recovery time for UV cured products of the resin compositions of Example 1 and Comparative Example 1.

While repeatedly performing a process of twisting and untwisting at each temperature, the creep/recovery strain rates by 300 cycles are listed in Table 5, and the time-dependent strain amounts are shown in the graph of FIG. 5.

TABLE 5

| Temperature | Comparative Example 1 Creep/recovery strain rate (%) | Example 1 Creep/recovery strain rate (%) |
|---|---|---|
| −20° C. | 7.4/5.7 | 6.0/3.8 |
| 25° C. | 15.0/3.8 | 7.0/0.8 |
| 60° C. | 13.4/0.4 | 9.5/0.3 |

Referring to Table 5 and FIG. 5, because the UV cured product of the resin composition of Example 1 maintained the creep/recovery strain rate at less than or equal to 4.5% even at −20° C., it was confirmed that the resin composition of Example 1 had excellent adhesion retention properties at low temperatures.

Figure 6:
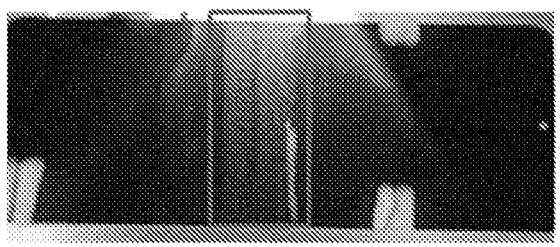
FIG. 6 are photographs showing the appearance of display apparatuses of Example 1 (Good) and Comparative Example 1 (Defective) after repeatedly folding 30,000 times.
Figure 6:
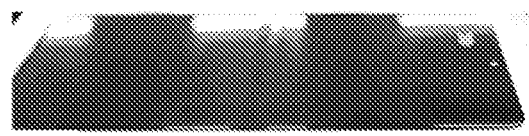

Evaluation Example 4: Evaluation of Reliability by Repeated Folding at Low Temperature After each of the resin compositions of Example 1 and Comparative Example 1 was arranged between a display panel and a cover window, a UV curing process was performed thereon to obtain a display apparatus sample. For each display apparatus sample, a folding/unfolding process was repeatedly performed at a temperature of −20° C., and the degree of separation of the display panel and the cover window was determined. Results are shown in the photograph of FIG. 6.

When the resin composition prepared in Comparative Example 1 was used, the display panel and the cover window became separated (photograph labeled Defective). In contrast, when the resin composition prepared in Example 1 was used, the display panel and the cover window did not separate (or show visible signs of separation) and showed good bonding properties (photograph labeled Good).

It was confirmed that the resin composition prepared in Example 1 had a rigid structure without deformation or damage to the adhesive layer even after folding/unfolding 30,000 times.

According to the one or more embodiments, a resin composition may be applied with an inkjet printing process, and thus it may be applied to the manufacture of a large-area display device. Furthermore, when the resin composition is provided between a display panel and a cover window to form a photocurable adhesive layer, the creep/recovery strain is reduced during repeated folding and unfolding of the display device, thereby ensuring firm bonding between the display panel and the cover window.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A resin composition comprising:
a modified (meth)acrylic-urethane oligomer having a weight average molecular weight (Mw) of greater than or equal to 25,000 grams per mole and a glass transition temperature of less than or equal to −30° C.;
a photopolymerizable monomer; and
a photoinitiator.

2. The resin composition of claim 1, wherein the modified (meth)acrylic-urethane oligomer comprises an alicyclic group.

3. The resin composition of claim 1, wherein the modified (meth)acrylic-urethane oligomer is a copolymer of an alicyclic group-containing diisocyanate-based monomer and a glycol-based diol monomer.

4. The resin composition of claim 1, wherein the modified (meth)acrylic-urethane oligomer has an isocyanate group at each terminal ends of the oligomer.

5. The resin composition of claim 1, wherein the photopolymerizable monomer comprises a monofunctional (meth)acrylate, a polyfunctional (meth)acrylate including two or more acrylic groups, or a combination thereof.

6. The resin composition of claim 5, wherein the monofunctional (meth)acrylate comprises a polar group-containing monofunctional (meth)acrylate and polar group-free monofunctional (meth)acrylate.

7. The resin composition of claim 1, wherein the photoinitiator comprises a benzophenone-based compound, an anthraquinone-based compound, a benzoin-based compound, an acetophenone-based compound, an α-aminoalkylphenone-based compound, an acylphosphine oxide-based compound, or a combination thereof.

8. The resin composition of claim 1, wherein the modified (meth)acrylic-urethane oligomer is present in a range of about 5 parts by weight to about 15 parts by weight, based on a total of 100 parts by weight of the resin composition.

9. The resin composition of claim 1, wherein the photopolymerizable monomer comprises, based on a total of 100 parts by weight of the resin composition, a polar group-containing monofunctional (meth)acrylate in a range of about 20 parts by weight to about 30 parts by weight, a monofunctional (meth)acrylate without a polar group in a range of about 55 parts by weight to about 70 parts by weight, and a polyfunctional (meth)acrylate including two or more (meth)acrylic groups in a range of about 0.1 part by weight to about 2.0 parts by weight.

10. The resin composition of claim 1, wherein the resin composition has viscosity in a range of about 18 centipoise to about 20 centipoise at 25° C., and surface tension in a range of about 26 millinewton per meter mN/m to about 28 millinewton per meter at 25° C.

11. The resin composition of claim 1, wherein the resin composition has density in a range of about 0.091 grams per cubic centimeter to about 0.95 grams per cubic centimeter at 25° C.

12. The resin composition of claim 1, wherein the resin composition has creep recovery strain rate of less than or equal to 4.5% at −20° C.

13. A display apparatus comprising:

a display panel;

a cover window arranged on the display panel; and a photocurable adhesive layer arranged between the display panel and the cover window, wherein the photocurable adhesive layer comprises:

a modified (meth)acrylic-urethane oligomer having a weight average molecular weight (Mw) of greater than or equal to 25,000 grams per mole and a glass transition temperature (Tg) of less than or equal to −30° C.;

a photopolymerizable monomer; and a photoinitiator.

14. The display apparatus of claim 13, wherein the modified (meth)acrylic-urethane oligomer comprises an alicyclic group.

15. The display apparatus of claim 13, wherein the modified (meth)acrylic-urethane oligomer is a copolymer of an alicyclic group-containing diisocyanate-based monomer and a glycol-based diol monomer.

16. The display apparatus of claim 13, wherein the photopolymerizable monomer comprises monofunctional (meth)acrylate, polyfunctional (meth)acrylate including two or more acrylic groups, or a combination thereof.

17. The display apparatus of claim 13, wherein the photoinitiator comprises a benzophenone-based compound, an anthraquinone-based compound, a benzoin-based compound, an acetophenone-based compound, an α-aminoalkylphenone-based compound, an acylphosphine oxide-based compound, or a combination thereof.

18. The display apparatus of claim 13, wherein the modified (meth)acrylic-urethane oligomer is present in a range of about 5 parts by weight to about 15 parts by weight, based on a total of 100 parts by weight of the photocurable adhesive layer.

19. The display apparatus of claim 13, wherein the photopolymerizable monomer comprises, based on a total of 100 parts by weight of the photocurable adhesive layer, a polar group-containing monofunctional (meth)acrylate in a range of about 20 parts by weight to about 30 parts by weight, a monofunctional (meta)acrylate without a polar group in a range of about 55 parts by weight to about 70 parts by weight, and a polyfunctional (meth)acrylate including two or more acrylic groups in a range of about 0.1 part by weight to about 2.0 parts by weight.

20. The display apparatus of claim 13, wherein the display apparatus is a foldable display apparatus.

* * * * *